United States Patent
Dono

(10) Patent No.: US 6,967,878 B2
(45) Date of Patent: Nov. 22, 2005

(54) REDUNDANCY ARCHITECTURE FOR REPAIRING SEMICONDUCTOR MEMORIES

(75) Inventor: Chiaki Dono, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 246 days.

(21) Appl. No.: 10/370,578

(22) Filed: Feb. 24, 2003

(65) Prior Publication Data

US 2003/0164510 A1 Sep. 4, 2003

(30) Foreign Application Priority Data

Mar. 1, 2002 (JP) .......................... 2002-056517

(51) Int. Cl.[7] .......................... G11C 29/00; G11C 7/00; G11C 16/06
(52) U.S. Cl. .................... 365/200; 365/201; 365/225.7; 365/185.09
(58) Field of Search ................. 365/200, 201, 365/225.7, 185.09

(56) References Cited

U.S. PATENT DOCUMENTS

| | | | |
|---|---|---|---|
| 5,598,373 A | * | 1/1997 | Wada et al. ........... 365/185.09 |
| 5,699,306 A | | 12/1997 | Lee et al. |
| 5,838,619 A | * | 11/1998 | Pascucci ................. 365/200 |
| 5,841,712 A | * | 11/1998 | Wendell et al. ........... 365/200 |
| 6,295,235 B1 | | 9/2001 | Nagai |
| 6,654,272 B2 | * | 11/2003 | Santin et al. .......... 365/185.09 |
| 6,687,157 B1 | * | 2/2004 | Liu et al. ............... 365/185.09 |

FOREIGN PATENT DOCUMENTS

JP     2002-25288     1/2002

* cited by examiner

Primary Examiner—Trong Phan
(74) Attorney, Agent, or Firm—Young & Thompson

(57) ABSTRACT

A redundancy architecture for improving the throughput of testing and repairing the semiconductor memory after packaging. A memory device is composed of a memory cell array including memory cells and first redundant cells, a data comparator comparing read data received from the memory cell array with anticipated data provided by an external tester to produce a data mismatch signal, a redundancy mapping circuit responsive to the data mismatch signal for detecting a defective address of the memory cell array, a nonvolatile memory storing the detected defective address, and a redundancy circuitry repairing the memory cell array by replacing ones of the memory cells associated with the defective address with the first redundant cells.

22 Claims, 11 Drawing Sheets

|  | STEP 1 | STEP 2 | STEP 3 |
|---|---|---|---|
|  | FUNCTION TEST | REDUNDANCY MAPPING | REPAIR |
| OPERATION OF TESTER 51 | ·PROVIDE COMMAND<br>·PROVIDE ADDRESS<br>·PROVIDE ANTICIPATED DATA<br>·COMPARE | ·PRODUCE REDUNDANCY MAPPING FROM DEFECTIVE CELLS TO REDUNDANT CELLS USING FBM | ·PROVIDE TEST COMMAND<br>·PROVIDE REDUNDANCY MAPPING |
| OPERATION OF MEMORY CHIP 52 |  |  | ·PROGRAM NVRAMS |

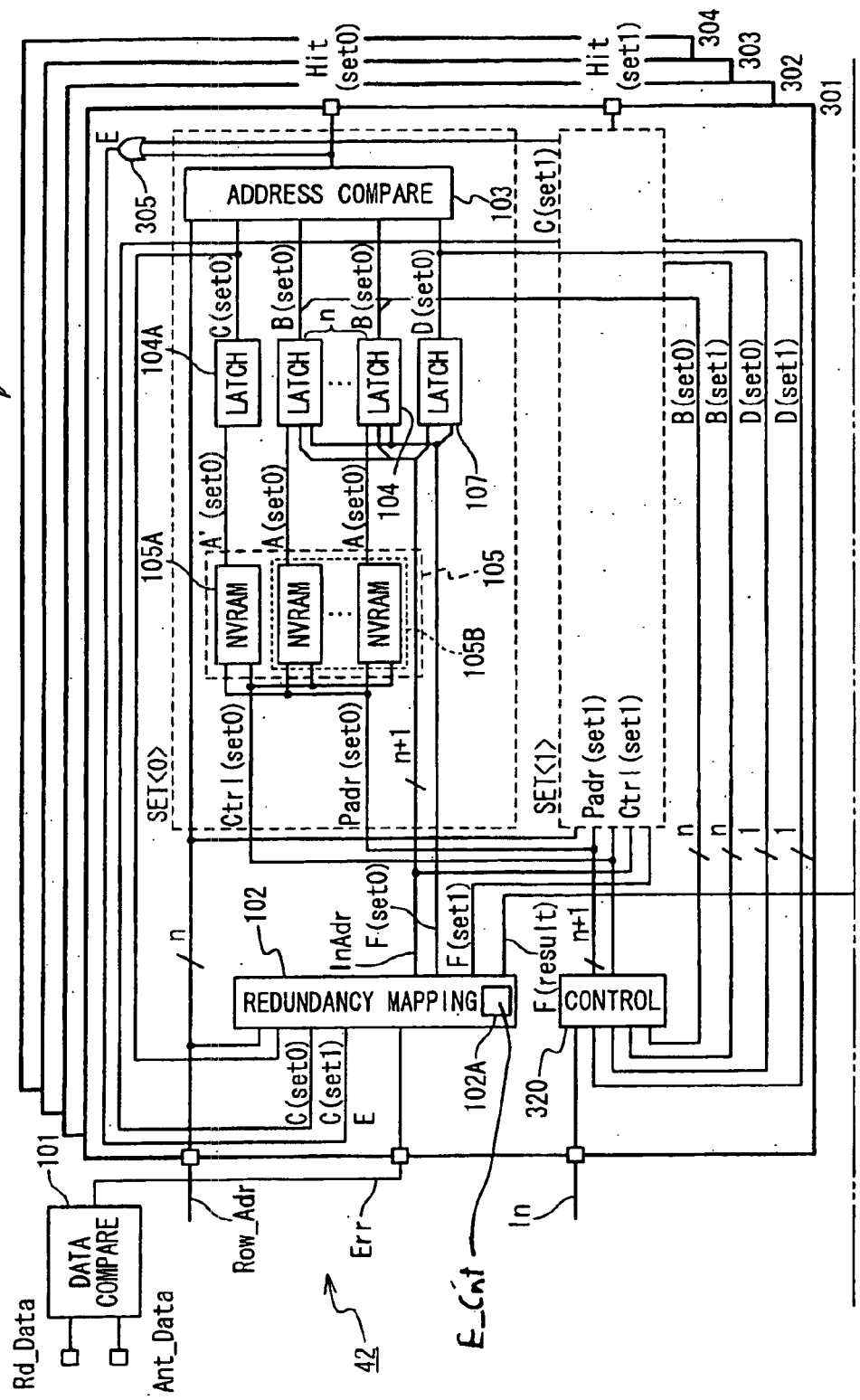

Fig. 6

| ADDRESS MATCH | INPUTS | | ERROR COUNT | OUTPUTS | | |
|---|---|---|---|---|---|---|
| | SET<1> ENABLE | SET<0> ENABLE | | SELECT SET<1> | SELECT SET<0> | BANK FAIL |
| E | C(set1) | C(set0) | count | F(set1) | F(set0) | F(result) |
| 1 | X | X | X | 0 | 0 | 0 |
| 0 (a1) | 0 | 0 | 0 | 0 | 1 | 0 |
| (b1) | 0 | 1 | 0 | 1 | 0 | 0 |
| (c1) | 1 | 0 | 0 | 0 | 0 | 1 |
| (d1) | 1 | 1 | 0 | 0 | 0 | 1 |
| (a2) | 0 | 0 | 1 | 1 | 0 | 0 |
| (b2) | 0 | 1 | 1 | 0 | 0 | 1 |
| (c2) | 1 | 0 | 2 | 0 | 0 | 1 |
| (d2) | 1 | 1 | 2 | 0 | 0 | 1 |
| (a3) | 0 | 0 | 2 | 0 | 0 | 1 |
| (b3) | 0 | 1 | 2 | 0 | 0 | 1 |
| (c3) | 1 | 0 | 3 | 0 | 0 | 1 |
| (d3) | 1 | 1 | 3 | 0 | 0 | 1 |
| (a4) | 0 | 0 | 3 | 0 | 0 | 1 |
| (b4) | 0 | 1 | 3 | 0 | 0 | 1 |
| (c4) | 1 | 0 | 3 | 0 | 0 | 1 |
| (d4) | 1 | 1 | 3 | 0 | 0 | 1 |

| | STEP 1 | STEP 2 | STEP 3 |
|---|---|---|---|
| | FUNCTION TEST AND REDUNDANCY MAPPING | REPAIR | |
| OPERATION OF TESTER 41 | ·PROVIDE COMMAND<br>·PROVIDE ADDRESS<br>·PROVIDE ANTICIPATED DATA | ·PROVIDE TEST COMMAND | |
| OPERATION OF MEMORY CHIP 42 | ·COMPARE<br>·PRODUCE REDUNDANCY MAPPING FROM DEFECTIVE CELLS TO REDUNDANT CELLS | ·PROGRAM NVRAMS | |

REDUNDANCY ARCHITECTURE FOR REPAIRING SEMICONDUCTOR MEMORIES

BACKGROUND OF THE INVENTION

1. Field of the Invention

The present invention relates, in general, to redundancy architecture for repairing semiconductor memories, and more particularly, to a redundancy architecture for improving a throughput of a test that includes repairing semiconductor memories.

2. Description of the Related Art

Redundancy is widely used in high-density semiconductor memories to improve product yield. As an example, a semiconductor memory may include redundant rows and columns, an address mapping circuit storing addresses of defective rows and columns, and a redundancy circuit for repairing defective rows and columns by redirecting the defective addresses to those of redundant rows and columns.

Defective addresses are often stored in fuses that are programmable by blowing them with laser beams. However, the use of the laser beams for programming the fuses requires blowing the fuses before packaging semiconductor memories into packages. This means that the semiconductor memories are not repairable after packaging, and thus the product yield is not effectively improved.

Use of programmable nonvolatile memories (NVRAMs) in place of the fuses effectively overcomes the drawback. Nonvolatile memories, including EPROMs (Electrically Programmable Read Only Memories), EEPROMS (Electrically Erasable Programmable Read Only Memories), allows defective addresses to be stored therein after packaging, and thus enables repairing semiconductor memories after packaging.

The use of a nonvolatile memory, however, increases a chip size of a semiconductor memory, because a nonvolatile memory requires a wider area per bit than a fuse circuitry.

A redundancy architecture for overcoming the aforementioned drawbacks is disclosed in Japanese Laid Open Patent Application (Jp-A 2002-25288), whose inventor is the same as the present invention. It should be noted that the aforementioned document was not yet disclosed one year before the priority date of this application, and thus the disclosed redundancy architecture should not be understood as a prior art.

FIG. 3 shows a synchronous dynamic random access memory (SDRAM) 10 including the disclosed redundancy architecture. The redundancy architecture is composed of both of a nonvolatile memory and a fuse circuit. The fuse circuit is programmed to store addresses of defective cells found before packaging the SDRAM 10, and the nonvolatile memory is programmed to store addresses of defective cells found after the packaging. Consequently, the redundancy architecture effectively avoids the chip size of the memory being increased.

In detail, the synchronous dynamic random access memory 10 is provided with a memory cell array 11, an address buffer 12, a command decoder 16, a mode register 17, a control logic circuit 18, a data input output circuit 19, a redundancy circuit 20 and a clock generator 21.

The memory cell array 11 is divided into banks <0> to <3> in which primary memory cells and redundant memory cells are arranged in rows and columns. The redundant memory cells are arranged in redundant columns 11a and redundant rows 11b. Each of the banks <0> to <3> includes a row address decoder 13, a column address decoder 14, and a sense amplifier 15.

The address buffer 12 receives bank address signals BA0 and BA1 and address signals A0 to A12 from an external circuit, such as a tester. The address buffer 12 demultiplexes the bank address signals BA0 and BA1 and the address signals A0 to A12 to identify a bank address, a row address and a column address.

The address signals A0 to A12 are also used for transferring a command instruction and a mode instruction. The command instruction is used for instructing the SDRAM 10 in the command, and the mode instruction is used for instructing the SDRAM 10 in an operation mode in which the SDRAM 10 is to be placed.

The row address decoder 13 receives and decodes the row address stored in the address buffer 12 to select rows associated with the row address.

The column address decoder 14 receives and decodes the column address to select a column associated with the column address.

The sense amplifier 15 identifies and outputs data store in the primary or redundant memory cells during a read operation, and also writes data into the memory cells during a write operation.

The command decoder 16 issues a command to control the SDRAM 10. The command decoder 16 receives control signals from an external circuit and the command instruction from the address buffer 12, and decodes the received control signals and command instruction to produce a command. The control signals includes a chip selection signal /CS indicative of whether the SDRAM 10 is selected, a row address strobe signal /RAS, a column address strobe signal /CAS, and a write enable signal /WE requesting a write operation. The slashes ("/") at the heads of the numerals denoting the control signals represent that the control signals are activated when they have a "low" level, that is, they are set to logic 0.

The command provided by the command decoder 16 includes a read command that requests a read operation, a write command that requests a write operation, a mode register set command (MRS command) that request a rewrite of the mode register 17, a bank activate command (ACT command) that requests an activation of memory banks, a pre-charge command (PRE command) that requests for pre-charging bit lines of the memory cell array 11, and a non-operation command (NOR command).

The mode register 17 stores therein an operation mode in which the SDRAM 10 is placed. In response to an MRS command being issued, the mode register 17 determines an operation mode in which the SDRAM 10 is to be placed on the basis of the mode instruction received from the address buffer 12. The determined operation mode is rewritten into the mode register 17. The operation mode includes a test mode and a normal mode.

The control logic circuit 18 is responsive to the command issued by the command decoder 16 and the operation mode stored in the mode register 17 for generating inner control signals. The address buffer 12, the row decoder 13, the column decoder 14, the sense amplifier 15, the data input/output buffer 19, and the redundancy circuit 20 operate in response to the inner control signals.

The data input output circuit 19 transfers data between the sense amplifier 15 and the external circuit through data inputs/outputs DQ0 to DQ15. The data input output circuit 19 receives read data from the memory cell array 11 through the sense amplifier 15 and outputs the read data to an external circuit. The data input output circuit 19 also receives write data inputted from an external circuit and outputs the write data to the sense amplifier 15. The data input output circuit 19 is responsive to a control signal DQM provided from an external circuit to selectively output the write data through the through the input/output terminal DQ0 to DQ15.

The clock generator 21 receives an external clock signal CLK and a clock enable signal CKE to generate an internal clock signal. The circuits implemented within the SDRAM 10 operate in synchronization with the generated internal clock signal.

The redundancy circuit 20 includes first and second defective address mapping and compare circuit 20A and 20B.

The first defective address mapping and compare circuit 20A includes a nonvolatile memory (NVRAM) storing defective addresses, and a first address compare circuit comparing received address to the defective addresses. The NVRAM may include an EPROM or an EEPROM. The address compare circuit compares the address received from the address buffer 12 to the defective addresses stored in the nonvolatile memory.

The second defective address mapping and compare circuit 20B includes a fuse circuit and a second address compare circuit (both not shown). The fuse circuit includes fuses storing other defective addresses. The second address compare circuit compares the received address to the defective addresses stored in the fuse circuit.

When the received address matches one of the defective addresses, the control logic circuit 18 controls the row decoder 13 and the column decoder 14 to activate the redundant rows and columns.

The defective addresses of the defective cells found before packaging the SDRAM 10 are stored in the fuse circuit of the second defective address mapping and compare circuit 20B. When a defective cell is found by the test before packaging, the fuse circuit is programmed by blowing the fuses with laser beams to store the address of the defective cell.

On the other hand, the defective addresses of the defective cells found after the packaging are stored in the nonvolatile memory of the first defective address mapping and compare circuit 20A. Programming the nonvolatile memory is achieved by providing and writing data representative of the defective addresses.

The use of both the fuse circuit and the nonvolatile memory enables repairing the SDRAM 10 after the packaging while reducing the chip size of the SDRAM 10.

FIG. 1 shows a conventional process for repairing a semiconductor memory after packaging. The conventional repairing process exemplary includes the steps of testing functions of the semiconductor memory, using a tester 51 as described below with respect to FIG. 2, producing a mapping from defective addresses to redundancy rows or columns, and programming the nonvolatile memory.

With reference to FIG. 2, semiconductor memories 52 are generally tested and repaired using a tester 51 that may be connected to a personal computer 53. The tester 51 includes a comparator and a fail bit memory (FBM, not shown) and operates on the basis of EWS software. The testing of the functions begins with providing the memory chips 52 respectively including semiconductor memories with test patterns by the tester 51. The memory chips are tested one at a time so that a first memory chip 52 is "ON TEST" and the remaining memory chips 52 are "WAITING" to be tested. The test patterns include test addresses and test data. The tester 51 then receives read data from the semiconductor memories and compares the received read data to anticipated data by the comparator to produce pass/fail data representative of defective cells. The pass/fail data is stored in the fail bit memory.

When a defective cell is found during the function test, the tester 51 produces a mapping from the defective address(es) to the redundancy row(s) or column(s). The tester 51 then places the defective semiconductor memory in a test mode to allow the nonvolatile memory to be programmed. Then, the tester 51 programs the nonvolatile memory to store the defective address(es).

A drawback of the conventional repairing process is that considerable costs are required for testing and repairing many semiconductor memories concurrently. To test and repair a plurality of semiconductor memories in parallel, the same number of expensive comparators and expensive fail bit memories are required. Thus, the increase of the semiconductor memories tested and repaired in parallel requires testers to be increased in the number thereof, or to be implemented with many comparators and fail bit memories. Consequently, the parallel testing and repairing drives up the costs.

Another drawback of the conventional repairing process is that it increases a throughput of the testing and repairing because the data transfer between the tester and the semiconductor memory causes considerable delays. The conventional repairing process requires that the tester 51 and the memory chip 52 exchange large data. The data to be exchanged typically includes write data to be written in the memory cell array 10, test addresses, a command, read data from the memory cell array 10, defective addresses to be stored in the NVRAM the first defective address mapping and-compare circuit 20A, and a test command to allow the NVRAM to be programmed. Exchanging large data increases the throughput of testing and repairing the memory chip 52, and thus is undesirable, because the increase in the throughput considerably raises the cost of the semiconductor memory.

A need exists to provide a redundancy architecture for improving the throughput of testing and repairing the semiconductor memory with a redundancy architecture after packaging, and simultaneously reducing the chip size thereof.

SUMMARY OF THE INVENTION

Therefore, an object of the present invention is to provide a redundancy architecture for improving the throughput of testing and repairing the semiconductor memory after packaging.

Another object of the present invention is to provide a redundancy architecture for reducing the chip size of a semiconductor memory.

In an aspect of the present invention, a memory device is composed of a memory cell array including memory cells and first redundant cells, a data comparator comparing read data received from the memory cell array with anticipated data provided by an external tester to produce a data mismatch signal, a redundancy mapping circuit responsive to the data mismatch signal for detecting a defective address of the memory cell array, a nonvolatile memory storing the detected defective address, and a redundancy circuitry repairing the memory cell array by replacing ones of the memory cells associated with the defective address with the first redundant cells.

The defective address preferably consists of one of row and column addresses of the memory cell array.

It is advantageous if the memory device is further composed of a fuse circuit including fuses storing both of a defective row address and a defective column address of the memory cell array, the memory cell array further includes second redundant cells, and the redundancy circuitry repairs the memory cell array by replacing ones of the memory cells associated with the defective row and column addresses stored in the fuse circuit with the second redundant cells.

It is advantageous if the nonvolatile memory stores therein an NVRAM enable bit representative of whether the defective address is effectively stored in the nonvolatile memory, and the redundancy mapping-circuit provides an enable signal to allow the nonvolatile memory to store the defective address of the memory cell array detected by the redundancy mapping circuit in response to the NVRAM enable bit.

The redundancy mapping circuit preferably produces a failure signal representative of a failure of the memory device in response to the NVRAM enable bit and the data mismatch signal.

The memory device is preferably additionally composed of a nonvolatile element storing a device failure bit representative of the failure of the memory device in response to the failure signal.

It is advantageous if the redundancy circuitry includes an address compare circuit comparing the defective address detected by the redundancy mapping circuit with the defective address stored in the nonvolatile memory to produce a disable signal, and the redundancy mapping circuit provides an enable signal to allow the nonvolatile memory to store the detected defective address in response to the disable signal.

When the memory device includes a decoder circuitry, it is advantageous if the address compare circuit compares the detected defective address with the stored defective address when the memory device is placed in a first mode, the address compare circuit compares a received address with the stored defective address to produce an address hit signal when the memory device is placed in a second mode, and the decoder circuitry selects, in response to the address hit signal, the first redundant cells instead of ones of memory cells associated with the received address.

In another aspect of the present invention, a memory device is composed of a memory cell array including primary memory cells arranged in primary rows and redundant memory cells arranged in redundant rows, a plurality of nonvolatile memories respectively storing defective row addresses, a redundancy circuitry repairing the memory cell array by replacing one of the primary rows associated with the defective address with the redundant rows, a data comparator comparing read data received from the memory cell array to anticipated data provided by an external tester to produce a data mismatch signal, and a redundancy mapping circuit. The plurality of nonvolatile memories respectively stores NVRAM enable bits representative of whether the defective row addresses respectively stored in the nonvolatile memories are effective. The redundancy mapping circuit is responsive to the data mismatch signal for detecting a defective row address and selecting one of the plurality of nonvolatile memories in response to the NVRAM enable bits. The selected one of the plurality of nonvolatile memories stores the detected defective row address.

It is advantageous if the redundancy mapping circuit includes an error counter storing a number of defective rows found to be replaced through a function test, and the redundancy mapping circuit selects the one of the plurality of nonvolatile memories based on the number of defective rows.

The redundancy mapping circuit preferably activates a fail signal based on the NVRAM enable bits and the number of defective rows when judging that the memory device is unrepairable.

It is advantageous if the redundancy circuitry includes an address compare circuitry comparing the defective row address detected by the redundancy mapping circuitry with the defective row addresses stored in the nonvolatile memory to activate a disable signal, and the redundancy mapping circuit selects none of the plurality of nonvolatile memories in response to the activated disable signal.

When the memory device is additionally composed of a decoder circuitry, it is advantageos if the address compare circuit compares the detected defective address with the stored defective address when the memory device is placed in a first mode, the address compare circuit compares a received address with the stored defective address to produce an address hit signal when the memory device is placed in a second mode, and the decoder circuitry selects, in response to the address hit signal, the first redundant cells instead of ones of memory cells associated with the received address.

In still anther aspect of the present invention, a memory device is composed of a memory cell array including memory cells and redundant cells, a data comparator comparing read data received from the memory cell array to anticipated data provided by an external tester to produce a data mismatch signal, a redundancy mapping circuit responsive to the data mismatch signal for detecting a defective address of the memory cell array, a nonvolatile memory storing the detected defective address, a volatile latch circuit latching the defective address from the nonvolatile memory, an address compare circuit comparing a received address with the latched defective address to produce an address hit signal, and a decoder circuitry selecting, in response to the address hit signal, the redundant cells instead of ones of memory cells associated with the received address.

When the memory device is additionally composed of a control circuit, it is advantageous if the volatile latch circuit receives and latches the detected defective address from the redundancy mapping circuit when the memory device is placed in a first mode, the control circuit receives the latched defective address from the volatile latch circuit and writes the latched defective address in the nonvolatile memory, when the memory device is placed in a second mode, and the volatile latch circuit latches the defective address from the nonvolatile memory, and the address compare circuit compares the received address with the latched defective address to produce the address hit signal when the memory device is placed in a third mode.

The volatile latch circuit preferably latches the defective address from the nonvolatile memory in response to the memory device being started up.

When the memory device is additionally composed of a mode address register storing mode information on an operation mode in which the memory device is placed, the operation mode including the first to third mode, the volatile latch circuit latches the defective address from the nonvolatile memory in response to an issue of an MRS command to allow the mode address register to rewrite the mode information.

BRIEF DESCRIPTION OF THE DRAWINGS

FIGS. 5A and 5B show a schematic of an NVRAM-based redundancy circuit;

FIG. 6 shows an operation of a redundancy mapping circuit;

DESCRIPTION OF THE PREFERRED EMBODIMENTS

The present invention will be described below in detail with reference to the attached drawings.

Memory Device Structure

Figure 3:
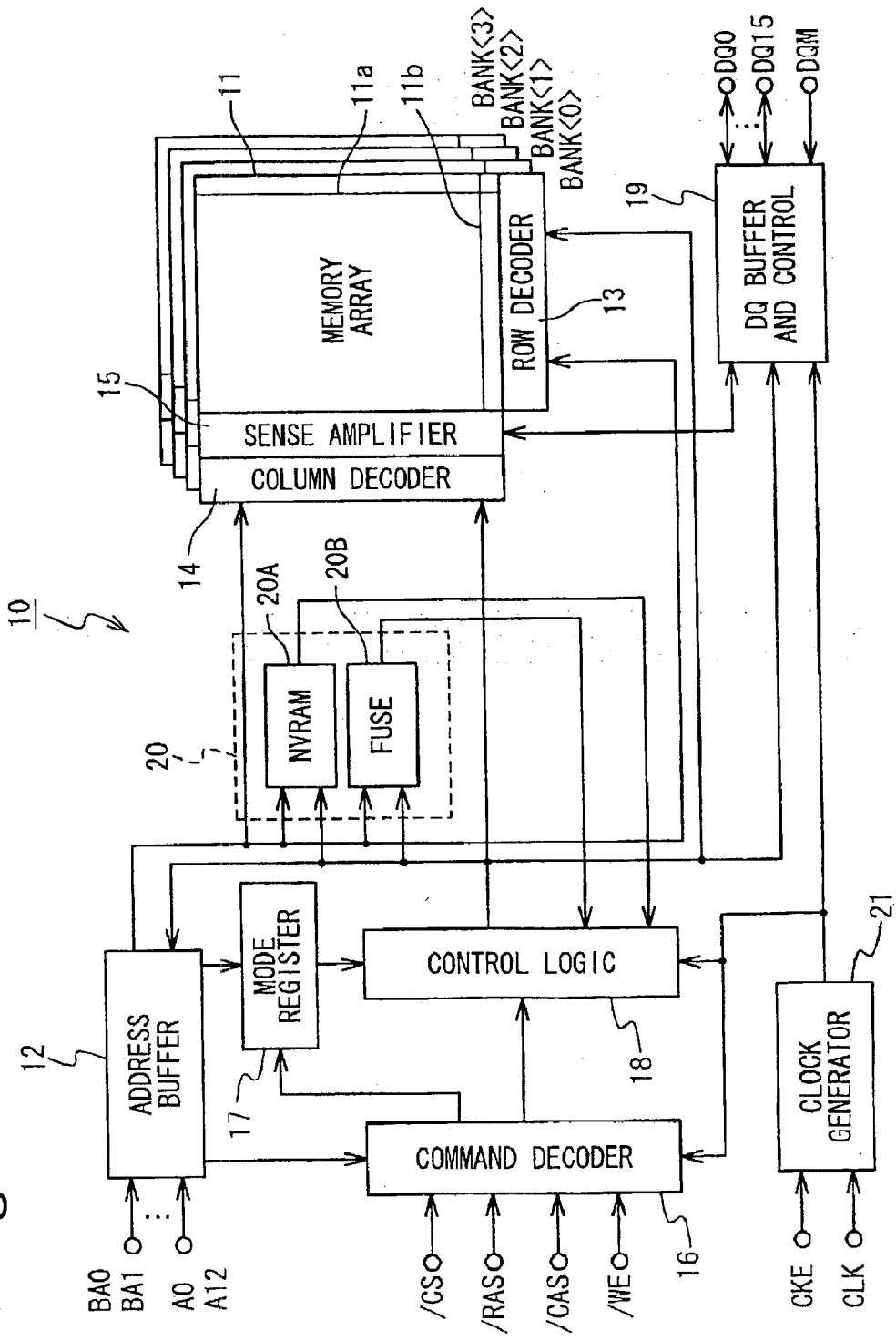
FIG. 3 shows a block diagram of a memory device with a redundancy architecture related to the present invention.
Figure 4:
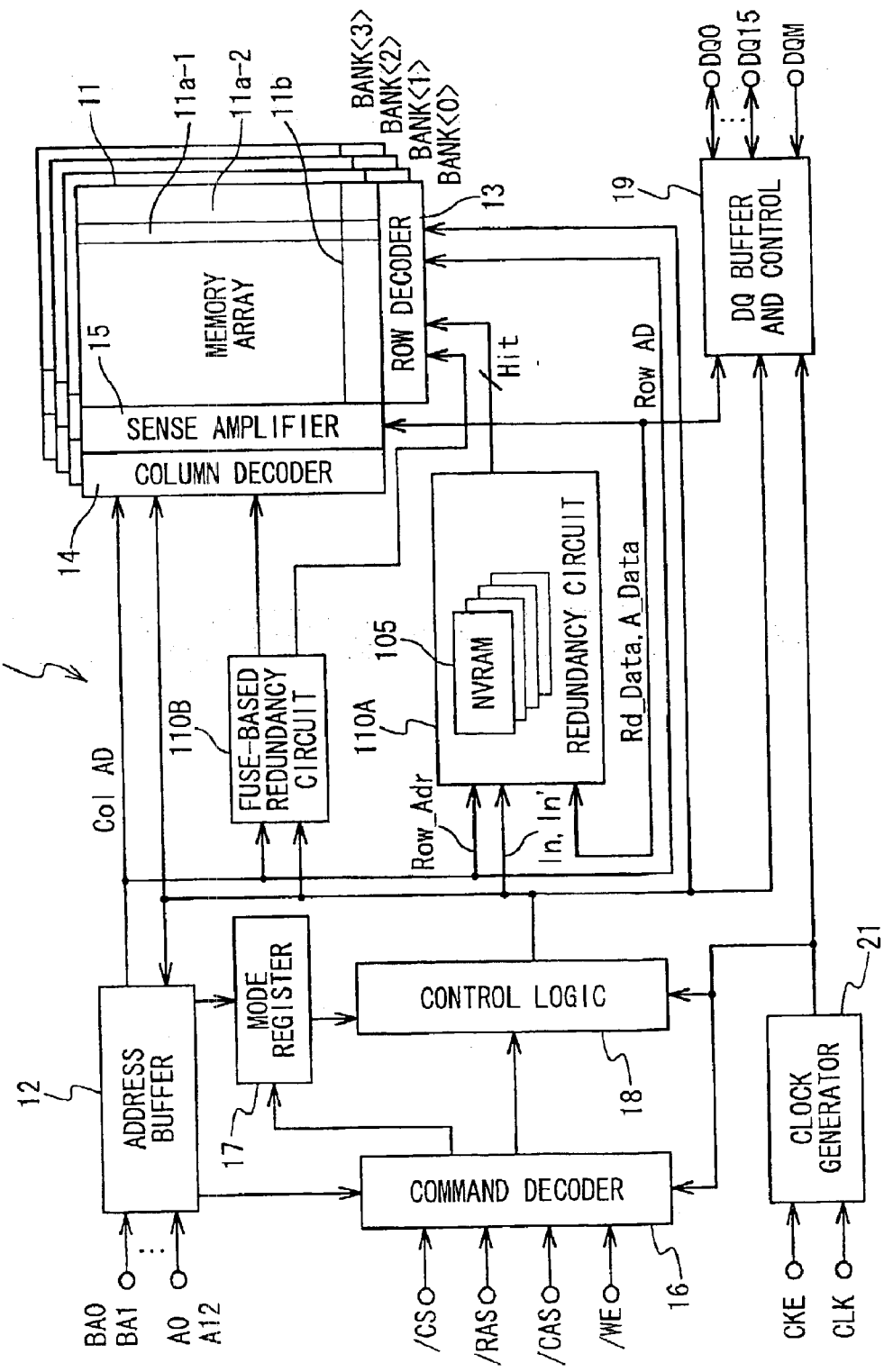
FIG. 4 shows a block diagram of a memory device in one embodiment in accordance with the present invention.

FIG. 4 shows a block diagram of a monolithic SDRAM 10 provided on a memory chip 42 including a redundancy architecture in accordance with the present invention. It should be noted that an element shown in FIG. 4 and its corresponding elements shown in FIG. 3 are denoted by the same numeral to represent that they have a substantially identical function, and thus a detailed explanation thereof may be omitted.

The SDRAM 10 includes a memory cell array 11, an address buffer 12, a command decoder 16, a mode register 17, a control logic circuit 18, a data input/output buffer 19, a clock generator 21, a NVRAM-based redundancy circuitry 110A, a fuse-based redundancy circuitry 110B.

The memory cell array 11 includes memory banks <0> to <3>, and each of the memory banks is provided with memory cells arranged in rows and columns, redundant cells, a row decoder 13, a column decoder 14, and a sense amplifier 15. The redundant memory cells are arranged in redundant rows 11a-1 and 11a-2 and redundant columns 11b.

The NVRAM-based redundancy circuitry 110A and the fuse-based redundancy circuitry 110B are used for repairing the memory cell array 11 by replacing defective memory cells with redundant cells.

The NVRAM-based redundancy circuitry 110A and the fuse-based redundancy circuitry 110B are used for different purposes. The NVRAM-based redundancy circuitry 110A is used for repairing defective memory cells found by a function test after packaging the memory chip 42 into a memory package, while the fuse-based redundancy circuitry 110B is used for repairing defective memory cells found before the packaging.

The NVRAM-based redundancy circuitry 110A replaces the defective rows found after the packaging with the redundant rows 11a-1. The NVRAM-based redundancy circuitry 110A includes a NVRAM circuitry to permanently store the defective row addresses. The NVRAM circuitry may include EPROMS, EEPROMs, or electrically programmable anti-fuses. The replacement of the defective rows is achieved on the basis of the defective row addresses stored in the NVRAM circuitry.

The fuse-based redundancy circuitry 110B replaces the defective rows and columns found before the packaging with the redundant rows 11a-2, and redundant columns 11b, respectively. The fuse-based redundancy circuitry 110B includes fuses that are programmed so as to store both of defective row addresses and defective column addresses. The programming of the fuses are achieved by blowing the fuses with laser beams. The replacement of the defective rows and columns is achieved on the basis of the defective row and column addresses stored on the fuses.

The NVRAM-based redundancy circuitry 110A adopts an on-chip mapping redundancy architecture, that is, the NVRAM-based redundancy circuitry 110A is designed to be able to determine a mapping from the defective rows to the redundant rows 11a-1 by itself. The NVRAM-based redundancy circuitry 110A programs the NVRAM circuitry to store the defective row addresses without receiving the defective row addresses from an external tester.

The on-chip mapping redundancy architecture reduces the amount of data transferred between the external tester and the SDRAM 10, and thus effectively improves the throughput of the test and repair of the SDRAM 10.

In addition, the on-chip mapping redundancy architecture is advantageous for increasing the number of semiconductor memories tested and repaired in parallel. The on-chip mapping redundancy architecture requires the tester only to provide test patterns including write data, anticipated read data, test address, and so on. The tester is not required to include expensive FBMs (fail bit memories) and comparators, and a high-speed processor, because the tester does not determine the defective addresses and the mapping from the defective addresses to the redundant cells. This reduces the costs for increasing the number of semiconductor memories tested and repaired concurrently.

The detailed structure of the NVRAM-based redundancy circuitry 110A is described below.

NVRAM-Based Redundancy Circuit

One may consider that the on-chip production of the mapping from the defective row addresses to the redundant rows is easily achieved by providing each memory device with a test circuit of a conventional tester, such as a comparator, an FBM, a pattern generator, a test pattern storage device storing test patterns and so on.

However, this is not the case. Firstly, the conventional tester requires an FBM that is able to store the same number of bits as the memory cells of the memory device. Implementing such an FBM within the redundancy architecture of the memory device makes no sense from the commercial viewpoint.

Second, the size of a pattern generator and a test pattern storage device is considerably large. Such a pattern generator and a test pattern storage device are preferably excluded from the redundancy architecture from the viewpoint of the cost.

Thus, the NVRAM-based redundancy circuitry 110A is designed to exclude an FBM, a pattern generator, and a test pattern storage device, as described in the following.

Figure 5B:
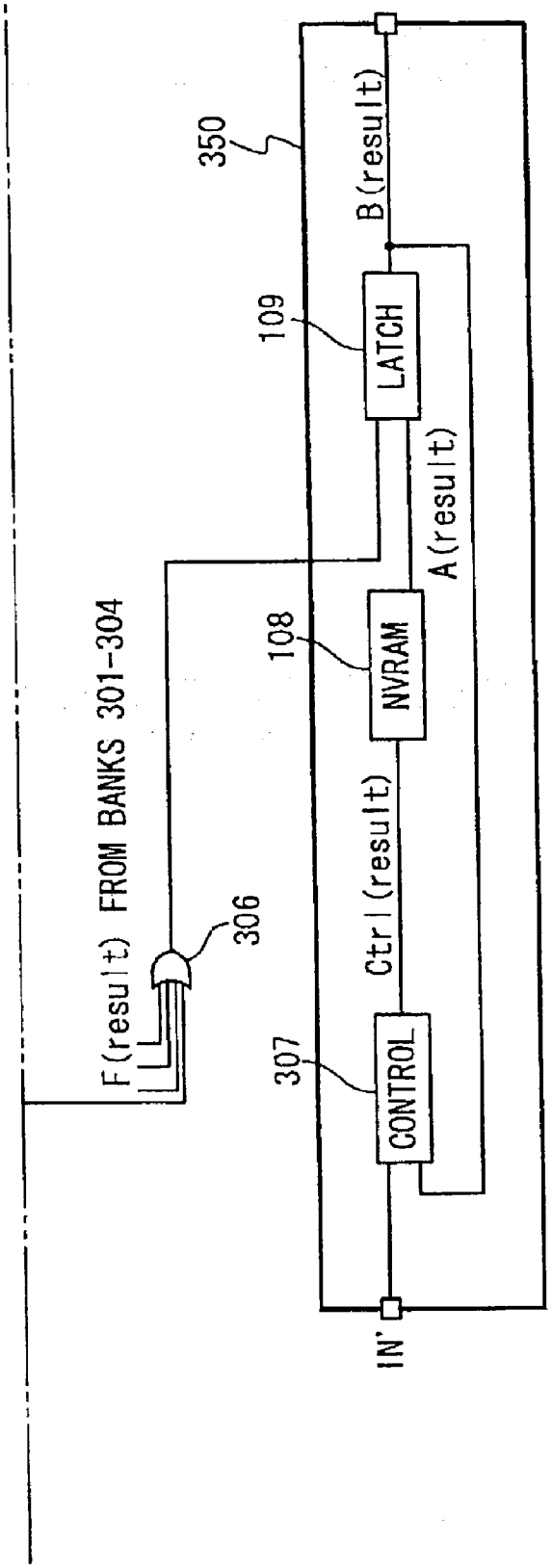

FIGS. 5A and 5B show a block diagram of the NVRAM-based redundancy circuitry 110A. The redundancy circuitry 110A includes a data comparator 101, and a plurality of redundancy banks 301 to 304 as shown in FIG. 5A. The data comparator 101 is coupled to each of the redundancy banks 301 to 304.

Each of the redundancy banks 301 to 304 includes a redundancy mapping circuit 102, a plurality of address sets SET<i>, an OR gate 305, and a control circuit 320. Each of the address sets SET<i> includes an NVRAM (nonvolatile memory) 105, an NVRAM enable latch 104A, a latch array 104, a latch enable latch 107, and an address compare circuit 103. The NVRAM enable latch 104A, the latch array 104, the latch enable latch 107 are volatile.

Each nonvolatile memory 105 includes a nonvolatile element 105A storing an NVRAM enable bit A'(set i) and a nonvolatile element array 105B storing a defective row address identifying a defective row. The defective rows are replaced with the redundant rows on the basis of the defective row addresses stored in the nonvolatile element arrays 105B The redundancy banks 301 to 304 are respectively associated with the memory banks <0> to <3> of the memory cell array 11 in one-to-one relation. Each of the redundancy banks 301 to 304 is used for repairing its associated memory bank. It should be understood that the number of the redundancy banks and the memory banks is not limited to four.

The address sets SET<i> are respectively associated with redundant rows 11a-1 in one-to-one relation. Each of the address sets SET<i> repairs one defective row by replacing it with its associated redundant row. It should be also understood that the number of the address sets SET<i> included in each of the redundancy banks 301 to 304 is not limited to two.

The data comparator 101 is used to detect the failure or defection of each memory cell. When a test address is provided for the SDRAM 10 from an external tester, the data comparator 101 receives read data Rd_Data from the memory cell identified by the test address, and receives anticipated data Ant_Data from the external tester through the data input/output buffer 19. The data comparator 101 compares the read data Rd_Data to anticipated data Ant_Data to produce a data mismatch signal Err. When the read data Rd_Data differs from the anticipated data Ant_Data, the data comparator 101 activates the data mismatch signal Err, that is, the data comparator 101 sets the data mismatch signal Err to logic 1. The data mismatch signal Err is inputted to each of the redundancy mapping circuits 102 of the redundancy banks 301–304.

Each redundancy mapping circuit 102 is used to determine a redundancy mapping from the defective row addresses to redundant rows 11a-1 with respect to its associated memory bank. Each redundancy mapping circuit 102 receives the data mismatch signal Err from the data comparator 101 and a row address signal Row_Adr representative of the row address of the test address from the address buffer 12. On the basis of the data mismatch signal Err and the row address signal Row_Adr, the redundancy mapping circuit 102 detects defective rows and determines the addresses of the defective rows, that is, defective row addresses. When detecting a defective row, the redundancy mapping circuit 102 selects one of the address sets SET<i> used for repairing the detected defective row. The redundancy mapping circuit 102 enables the selected one of the address sets SET<i> by activating one of enable signals F(set i), and outputs the determined defective row address InAdr to the enabled address set.

The address sets SET<i> is given increased priority as the index "i" increases in repairing the defective row. In this embodiment, the address set SET<0> is given priority over the address set SET<1>. When a first defective row is found, the address set SET<0> is used for repairing the first defective row. When a second defective row is then found, the address set SET<1> is used for repairing the second defective row.

The redundancy mapping circuit 102, however, selects none of the address sets SET<i> in the following cases even if detecting a defective row address. The first case is that the detected defective row is already repaired by any of the address sets SET<i>. In this case, the redundancy mapping circuit 102 ignores the detected defective row.

The second case is that the memory bank associated with the redundancy mapping circuit 102 is unrepairable because the number of the redundant rows 11a-1 is less than the number of the detected defective rows in the respective memory banks.

To determine whether the associated memory bank is repairable, the redundancy mapping circuit 102 includes an error counter 102A storing the error count value E_Cnt representative of the number of the defected rows found to be repaired during a function test. The error counter 102A increases the error count value Count by one every time the determined defective row address InAdr is outputted to the address sets SET<i>.

It should be noted that the error counter 102A is volatile, and thus the error count value E_Cnt is reset when a function test is completed and the power supplied to the SDRAM 10 is turned off.

When judging that the associated memory bank is unrepairable, the redundancy mapping circuit 102 activates a bank disable signal F(result) instead of activating the enable signals F(set i). The bank disable signal F(result) is used for determining whether the SDRAM 10 is commercially available while testing and repairing the SDRAM 10.

The selected address set SET<i> receives the defective row address determined by the redundancy mapping circuit 102 on the latch array 104. The latch array 104 latches the determined defective row address InAdr and temporarily stores it till the latched defective row address is transferred to the NVRAM 105 implemented within the same address set SET<i>. The defective row address latched by the latch array 104 in address set SET<i> is denoted by B(set i).

The selected address set SET<i> also receives the enable signal F(set i) on the latch enable latch 107. The latch enable latch 107 latches the enable signal F(set i) to produce a latch enable signal D(set i). When the enable signal F(set i) is activated, the latch enable signal D(set i) is also activated. The latch enable signal D(set i) represents whether the latched defective row address B(set i) is effective. The latched defective row addresses B(set i) and the latch enable signals D(set i) are provided for the control circuit 320.

The control circuit 320 is responsive to an inner control signal In from the control logic circuit 18 for transferring the latched defective row addresses B(set i) to the NVRAMs 105 in the address sets SET<i>. The inner control signal In is provided from the control logic circuit 18 on the basis of the command issued by the command decoder 16, and the operation mode stored in the mode register 17. When activated by the inner control signal In, the control circuit 320 transfers the latched defective row addresses B(set i) in response to the latch enable signals D(set i) from the latch enable latches 107 of the address sets SET<i>. The transferred defective row addresses is denoted by Padr(set i) in FIG. 5A.

The control circuit 320 transfers each defective row address B(set i) only when its associated latch enable signal D(set i) is activated. In response to the latch enable signals D(set i) being activated, the control circuit 320 respectively activates control signals Ctrl(set i).

The NVRAMs 105 of the address set SET<i> are respectively responsive to the control signals Ctrl(set i) for being activated. Each NVRAM 105 is programmed to store the defective row address Padr(set i) in the nonvolatile element array 105B, when its associated control signal Ctrl(set i) is activated. The defective row address stored in the nonvolatile element array 105B in the address set SET<i> is denoted by A(set i). Additionally, in response to its associated control signal Ctrl(set i) being activated, Each NVRAM 105 activates the NVRAM enable bit A'(set i) stored in the nonvolatile element 105A. The activated NVRAM enable bit A'(set i) represents that the defective row address A(set i) is effectively stored in the nonvolatile element array 105B.

The output of the nonvolatile element 105A is coupled to the NVRAM enable latch 104A. The NVRAM enable latch 104A in the address set SET<i> latches the NVRAM enable bit A'(set i) to generate an NVRAM enable signal C(set i). When the NVRAM enable bit A'(set i) is activated, the NVRAM enable signal C(set i) is also activated (that is, the NVRAM enable signal C(set i) is set to logic 1). The The output of the nonvolatile element array 105B is coupled to the latch array 104. The latch array 104, which is used to temporarily store the defective row address Inadr determined by the redundancy mapping circuit 102, is also used to latch the defective row address A(set i) stored in its associated NVRAM 105. Because the latch array 104, which typically comprises an array of flip-flops, is superior to the NVRAM 105 in the read cycle time, the latch array 104 is used to increase the access speed to access the defective row address A(set i). The latch array 104 in the address set SET<i> latches the defective row address A(set i) in response to the SDRAM 10 being started up, and/or, in response to the issue of the MRS command.

It should be noted that each latch array 104 is used for the following two purposes. The latch array 104 is used to temporarily store the defective row address InAdr, when its associated NVRAM 105 does not store a defective row address effectively. The temporarily stored defective row address is transferred to its associated NVRAM 105. On the other hand, the latch array 104 is used to latch the defective row address A(set i) once the defective row address A(set i) is effectively stored in the NVRAM 105. The output of the latch array 104 in the address set SET<i> is coupled to the address compare circuit 103 in the same address set SET<i>.

Each address compare circuit 103 is used for the different purposes depending on the operation mode in which the SDRAM 10 is placed. When the SRAM 10 is placed in the normal mode, the address comparator 103 receives from the address buffer 12 a row address of a target row including memory cells to be accessed. Then the address comparator 103 compares the received row address to the defective row address from its associated NVRAM 105 through the latch array 104. In response to the received row address matching the defective row address latched in its associated latch array 104, the address comparator 103 in the address set SET<i> activates the associated address hit signal Hit(set i). In response to one of the address hit signal Hit(set i) being activated, the row decoder 13 selects and activates the redundant row associated with the address set SET<i> instead of the target row.

During the test and repair of the SDRAM 10, on the other hand, the address comparator 103 determines whether the row address of the test address matches the defective row address latched in the latch array 104. The latched defective row address may be already stored in the NVRAM 105 or temporarily stored in the latch array 104 to be written into the NVRAM 105. During the test and repair, the activated address hit signal Hit(set i) indicates that the row identified by the test address is already proved to be defective, and already stored or determined to be stored in the NVRAM 105, and thus, the row address of the test address should not be written into the NVRAM 105 even if the row identified by the test address is determined to be defective.

The address comparator 103 in the address set SET<i> is responsive to the NVRAM enable signal C(set i) and the latch enable signal D(set i) for being enabled. When the NVRAM enable signal C(set i) and/or the latch enable signal D(set i) is activated, the address comparator 103 is allowed to activate the address hit signal Hit(set i). When none of the NVRAM enable signal C(set i) and the latch enable signal D(set i) is activated, it means that the latch array 104 does not latch a defective row address effectively, and thus the address comparator 103 retains the address hit signal Hit(set i) disabled.

The address hit signals Hit(set i) from the respective address sets SET<i> are inputted to the OR gate 305, and the OR gate 305 develops the address match signal E on the output. The activated address match signal E indicates that the row address of the defective row detected by the redundancy mapping circuit 102 should not be written into the NVRAM 105 (and the latch array 104).

The NVRAM enable signals C(set i), and the address match signal E are used for determining the operation of the redundancy mapping circuit 102. The error count value E_Cnt stored in the error counter 102A is not sufficient to determine the operation of the redundancy mapping circuit 102, because the error counter 102A is volatile. Because of the volatility, the error count value E_Cnt represents the number of the defective row(s) whose row address(es) is temporarily stored in the latch arrays 104 waiting to be stored in the NVRAMs 105, rather than the number of the defective row(s) whose row address es) is already stored in the NVRAMs 105. Consequently, the redundancy mapping circuit 102 is responsive to the NVRAM enable signals C(set i) and the address match signal E as well as the error count value E_Cnt for avoiding the different address sets SET<i> storing the same defective row address in the NVRAMs 105 or the latch array 104.

FIG. 6 shows a truth table describing the operation of the redundancy mapping circuit 102 in one embodiment. In response to the data mismatch signal Err being activated (that is, the read data Rd_Data differing from the anticipated data Ant_Data), the redundancy mapping circuit 102 outputs the enable signals F(set0), F(set1), and the bank disable signal F(result) according to the truth table as shown in FIG. 6 on the basis of the address match signal E, the NVRAM enable signals C(set0), C(set1), and the error count value E_Cnt.

When the address match signal E is set to logic 1 (that is, activated), it means that the defective row address determined by the redundancy mapping circuit 102 is already stored in one of the address sets SET<i>. Thus, the redundancy mapping circuit 102 disables the enable signals F(set0), F(set1), and the bank disable signal F(result), that is, sets them to logic 0.

When the address match signal E is set to logic 0, the redundancy mapping circuit 102 activates one of the enable signals F(set0), F(set1) to respectively select one of the address sets SET<0> and SET<1>, or activates the bank disable signal F(result).

With reference to the section (a1) in FIG. 6, the redundancy mapping circuit 102 activates the enable signal F(set0) to select the address set SET<0>, when both of the NVRAM enable signals C(set0), C(set1) is set to logic 0 and the error count value E__Cnt is zero, that is, no defective address is stored in the latch array 104 and the NVRAM 105. The redundancy mapping circuit 102 outputs the detected defective row address InAdr to the latch array 104 of the selected-address set SET<0>. The defective row address stored in the latch array 104 is then transferred by the control circuit 320 in response to the inner control signal In.

With reference to the section (b1) in FIG. 6, the redundancy mapping circuit 102 activates the enable signal F(set1) to select the address set SET<1>, when the NVRAM enable signals C(set0) and C(set1) are respectively set to logic 1 and 0, and the error count value E__Cnt is zero. This is the case when a defective address is stored in the NVRAM 105 of the address set SET<O>, and the NVRAM 105 of the address set SET<1> and the latch array 104 store no defective address. The redundancy mapping circuit 102 outputs the detected defective row address InAdr to the latch array 104 of the selected address set SET<0>.

With reference to the section (c1) in FIG. 6, the redundancy mapping circuit 102 activates the bank disable signal F(result) to represent the fail of the SDRAM 10, when the NVRAM enable signals C(set0) and C(set1) are respectively set to logic 0 and 1, and the error count value E__Cnt is zero. This is the case when the NVRAM enable signal C(set1) is accidentally set to logic 1 with the NVRAM enable signal C(set0) held logic 0. As mentioned above, the address set SET<0> is given priority over the address set SET<1>, and thus this logic state is prohibited. Consequently, the redundancy mapping circuit 102 activates the bank disable signal F(result).

With reference to the section (d1) in FIG. 6, the redundancy mapping circuit 102 also activates the bank disable signal F(result) to represent the fail of the SDRAM 10, when both of the NVRAM enable signals C(set0) and C(set1) are set to logic 1, that is, both of the NVRAMs 105 in the address sets SET<0> and SET<1> is already used to store the defective row address. In this case, all of the redundancy rows in the associated memory bank are already used for repairing, and thus the associated memory bank is unrepairable. Consequently, the redundancy mapping circuit 102 activates the bank disable signal F(result).

With reference to the section (a2) in FIG. 6, the redundancy mapping circuit 102 activates the enable signal F(set1) to select the address set SET<1>, when both of the NVRAM enable signals C(set0) and C(set1) are set to logic 0, and the error count value E__Cnt is one. This is the case when none of the NVRAMs 105 stores defective addresses while one of the latch arrays 104, that is, the latch array 104 in the address set SET<0> temporarily stores the detected defective row address. The temporarily stored defective row address is to written in the NVRAM 105 in the address set SET<0>, and thus the address set SET<1> is selected to store another defective row address. The redundancy mapping circuit 102 outputs the defective row address InAdr to the latch array 104 of the selected address set SET<1>.

In other cases, as shown in sections (b2) through (d4), the redundancy mapping circuit 102 activates the bank disable signal F(result) to represent the fail of the SDRAM 10, because the logic states are prohibited in the same way as the case relative to the section (c1) or the associated memory bank is unrepairable.

As shown in FIG. 5B, the NVRAM-based redundancy circuitry 110A additionally include an OR gate 306 and the test result memory circuit 350. The OR gate 306 receives the bank disable signals F(result) from each of the redundancy bank 301 to 304, and activates the output when at least one of the bank disable signals F(result).

The test result memory circuit 350 is responsive to the output of the OR gate 306 for storing information on whether the SDRAM 10 is commercially available. The test result memory circuit 350 includes a nonvolatile element 108, a latch 109, a controller 307.

The nonvolatile element 108 stores therein a device fail bit A(result) representative of whether the SDRAM 10 is failed.

The latch 109 is coupled to the output of the OR gate 306 and the nonvolatile element 108 to output a device fail signal B(result).

The controller 307 is responsive to the device fail signal B(result) and an inner control signal In' from the control logic circuit 18 to activate a control signal Ctrl(result). In response to the control signal Ctrl(result) being activated, the nonvolatile element 108 activates the device fail bit A(result).

The latch 109 is used for the following two purposes. First, the latch 109 latches and temporarily stores the logic state of the output of the OR gate 306 during the test and repair of the SDRAM 10. When the SDRAM 10 is determined to be unrepairable, the output of the OR gate 306 is activated during the test and repair of the SDRAM 10, and thus the device fail signal B(result) is also activated. When the test is completed, the controller 307 activates the device fail bit A(result) in response to the activated device fail signal B(result). This allows the device fail bit A(result) in the nonvolatile element 108 to be activated to indicate that the SDRAM 10 is failed.

Second, the latch 109 latches the device fail bit A(result) to activate the device fail signal B(result), when the SDRAM 10 is placed in a normal mode. The fail of the SDRAM 10 is indicated by the activated device fail signal B(result).

Once the latch 109 is set to logic 1 to activate the device fail signal B(result), the latch 109 is continuously set to logic 1 to maintain the device fail signal B(result) activated till the power is turned off.

Test and Repair Process

Figures 7, 8:
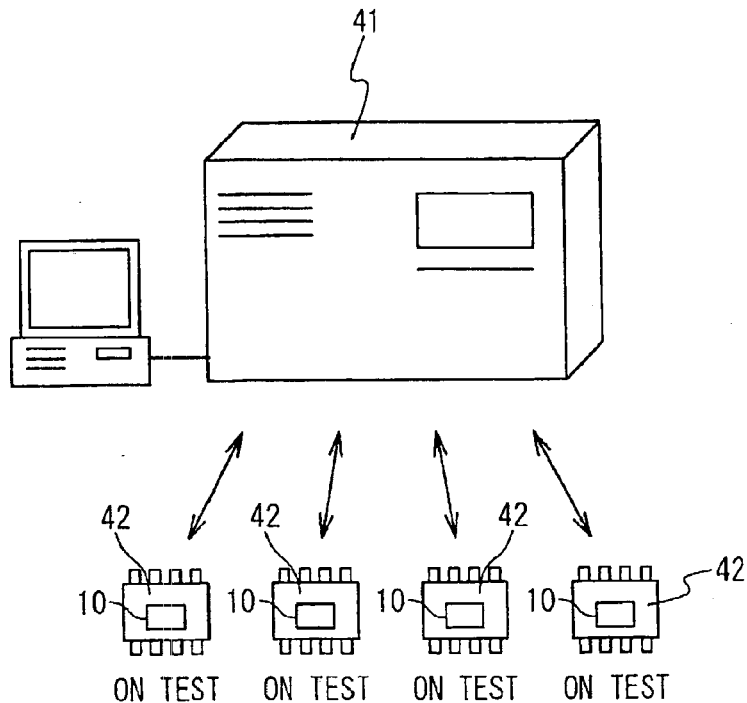
FIG. 7 shows a process of testing and repairing memory devices in one embodiment in accordance with the present invention.
FIG. 8 shows a tester used for testing and repairing memory devices in accordance with the present invention.

FIG. 7 shows a process of testing and repairing the SDRAM 10 after packaging in accordance with the present invention. The process includes Step 1 for concurrently executing a function test and producing a redundancy mapping from the defective row addresses to the redundant rows and Step 2 for programming the NVRAMs 105 to store the defective row addresses.

As shown in FIG. 8, the process is achieved using a tester 41. The SDRAM 10 on the memory chip 42 is tested by the tester 41 after being packaged into a memory package.

Figures 1, 2:
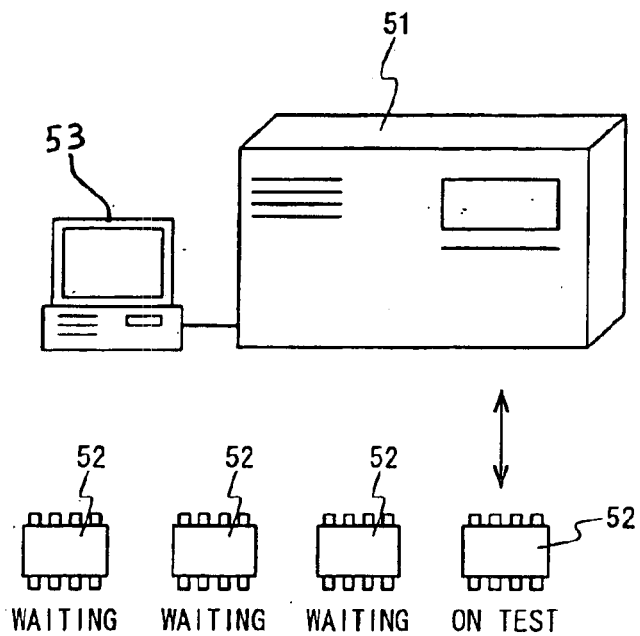
FIG. 1 shows a conventional process of testing and repairing memory devices.
FIG. 2 shows a tester used for testing and repairing memory devices.

The process of testing and repairing in accordance with the present invention is advantageous in the viewpoint of the throughput of testing and repairing because of the following reason. As mentioned above, the SDRAM 10 is designed to be able to determine the defective row addresses and to produce the mapping from the defective row addresses to the redundant rows. And thus, the tester 41 is required only to output the test pattern including the control signals for determining the command to be issued, the test addresses, and the anticipated data Ant_Data. This allows the generation of the test pattern and the production of the mapping to be concurrently executed. As shown in FIG. 1, the conventional method of testing and repairing requires the mapping of the defective row addresses to be executed after inputting the test pattern and inspect the read data. Consequently, the process in accordance with the present invention effectively reduces the throughput of testing and repairing.

Requiring the tester 41 only to output the test pattern is also advantageous to test a plurality of memory devices in parallel. The memory devices to be tested only require a common test pattern to be inputted thereto by the tester 41. The tester 41 does not need to provide different signals for each of the memory devices. This facilitates the concurrent test of an increased number of memory devices with a decreased cost.

The operations of the tester 41 and the SDRAM 10 are described in detail.

Step 1

Figure 9:
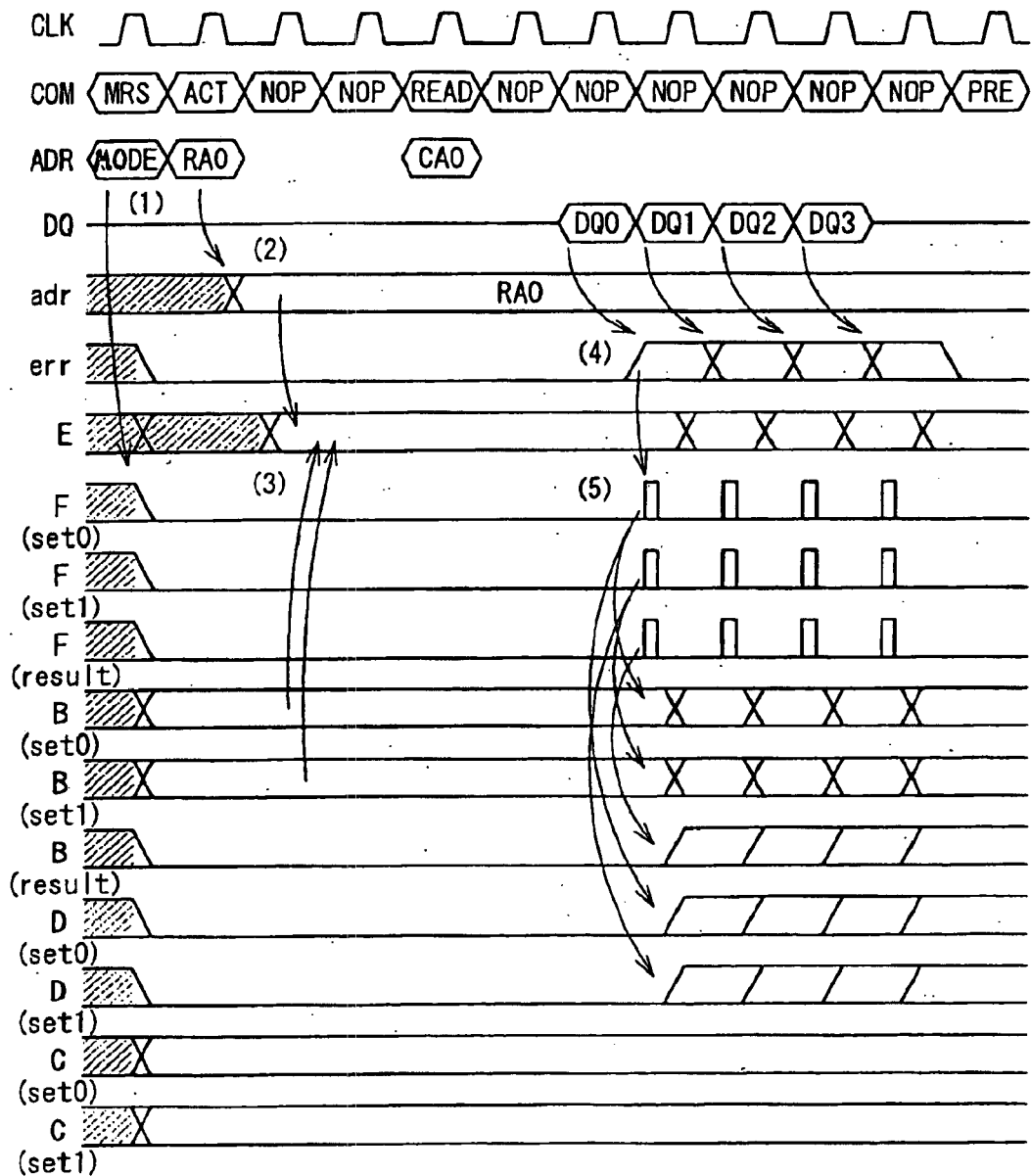
FIG. 9 is a timing chart showing a process of producing a mapping from defective row addresses to redundant rows and temporarily storing the defective row addresses in a latch array.

With reference to FIG. 9, the power is applied to the memory chip 42 to start up the SDRAM 10. All the NVRAM enable latches 104A, the latch arrays 104, and the latch enable latches 107 are initially reset.

The tester 41 provides the control signals /CS, /RAS, /CAS, /WE, the command instruction, and the mode instruction to allow the command decoder 16 to issue the MRS command, as represented by the symbol (1) in FIG. 9. The mode instruction is produced so as to place the SDRAM 10 in the test mode.

In response to the MRS command being issued, the latch arrays 104 latch the defective row addresses stored in its associated NVRAMs 105, and the NVRAM enable latches 104A latch its associated NVRAM enable bits A'(set i). Initially, none of the NVRAMs 105 stores defective row addresses and all the NVRAM enable bits A'(set i) are logic 0, and thus, all the latch arrays 104 and the NVRAM enable latch are initially reset.

The tester 41 then allows the command decoder 16 to issue a bank active command (ACT command). In response to the issue of the ACT command, one of the memory banks <0> to <3> is activated in accordance with the bank address signals BA0 and BA1. In the meantime, one of the redundancy bank 301 to 304 associated with the activated memory bank is activated.

In synchronization with the issue of the ACT command, the address signals A0–A12 are inputted from the tester 41 to the SDRAM 10 to indicate a row address (RA0) to be tested as indicated by the symbol (2). The row address is inputted to the mapping circuits 102, and the address compare circuits 103 implemented within the activated redundancy bank.

As indicated by the symbol (3), the address compare circuits 103 compares the received row address to the addresses stored in their associated latched arrays 104 to produce the address hit signals Hit(set i). The address match signal E is produced in response to the address hit signals Hit(set i).

The address compare circuits 103 activates the address hit signals Hit(set i) only when enabled by the NVRAM enable signals C(set i) or the latch enable signal D(set i). Consequently, the address compare circuits 103 initially holds the address hit signals Hit(set i) disabled because both of the NVRAM enable signals C(set i) and the latch enable signal D(set i) are initially disabled. As a result, the address match signal E is initially disabled.

Then, a read command is issued by the command decoder 16, the address signals A0–A12 then inputted from the tester 41 to the SDRAM 10 to indicate an initial column address (CA0) to be tested.

Then, the anticipated data is sequentially inputted from the tester 41 to the SDRAM 10 through the data input/output buffer 19. The anticipated data is inputted to the data comparator 101.

As indicated by the symbol (4) in FIG. 9, the read data RD_Data is transferred from the memory cell array 11 to the data comparator 101 in response to the READ command. The data comparator 101 compares the read data RD_Data to the anticipated data Ant_Data. When the read data RD_Data differs from the anticipated data Ant_Data, the data comparator 101 activates the data mismatch signal Err.

When the data mismatch signal Err is activated, the redundancy mapping circuit 102 of the activated redundancy bank determines the defective row address on the basis of the received row address Row_Adr. The redundancy mapping circuit 102 then activates one of the enable signals F(set i) to select the associated one of the address sets SET<i> or activates the bank disable signal F(result) as indicated by the symbol (5). When selecting one of the address sets SET<i>, the redundancy mapping circuit 102 outputs the detected defective row address to its associated latch array 104. The latch array 104 latches the outputted defective row address to develop the latched defective row address B(set i) on the output.

The column address is scanned in synchronized with the sequential input of the anticipated data Ant_Data, and thus all the memory cells included the identified row is tested. When the identified row includes a defective cell, the row-address thereof is stored in the latch array 104.

The same goes for all the rows and the memory banks, and the defective row addresses are temporarily stored in the latch arrays 104 if necessary.

An exemplary process of storing the defective row addresses in the latch arrays 104 will be described below. Let all the NVRAMs 105 be unprogrammed, that is, no defective address be stored in the NVRAMs 105 and no NVRAM enable bit A'(set i) be reset. In addition, let all of the error counter 102A, the NVRAM enable latches 104A, the latch arrays 104, and the latch enable latch 107 be reset. As a result, all of the NVRAM enable signals C(set0), C(set1), and the address match signal E are set to logic 0, and the error count value E_Cnt is set to zero.

When the data mismatch signal Err is activated during testing a specific row address of the memory bank <0>, the redundancy mapping circuit 102 of the redundancy bank 301, which is associated with the memory bank <0>, determines the specific row address to be a defective row address.

In response to all of the NVRAM enable signals C(set0), C(set1), and the address match signal E being logic 0 and the error count value E_Cnt being zero, the redundancy mapping circuit 102 activates the enable signal F(set0) to select the address set SET<0> (See FIG. 6).

The redundancy mapping circuit 102 outputs the defective row address to the latch array 104 of the address set SET<0>. In addition, the redundancy mapping circuit 102 sets the latch enable latch 107 of the address set SET<0> to logic 1 to represent that the latch array 104 of the address set SET<0> temporarily stores the defective row address.

When the data mismatch signal Err is activated during testing another row address of the memory bank <0>, the same goes for the other row address. Another defective row address is stored in the latch array 104 of the address set SET<1>, and the latch enable latch of the address set SET<1> is set to logic 1.

When still another defective row address is found, the redundancy mapping circuit 102 activates its associated bank disable signal F(result). In response to the bank disable signal F(result) from the redundancy bank 301 being activated, the OR gate 306 activates the output thereof to set the latch 109 to logic 1 in the test result memory circuit 350. The latch 109 then activates the device fail signal B(result) to represent that the SDRAM 10 is failed.

Step 2

After testing all the memory cells, the NVRAMs 105 are programmed to store the detected defective row addresses.

Figure 10:
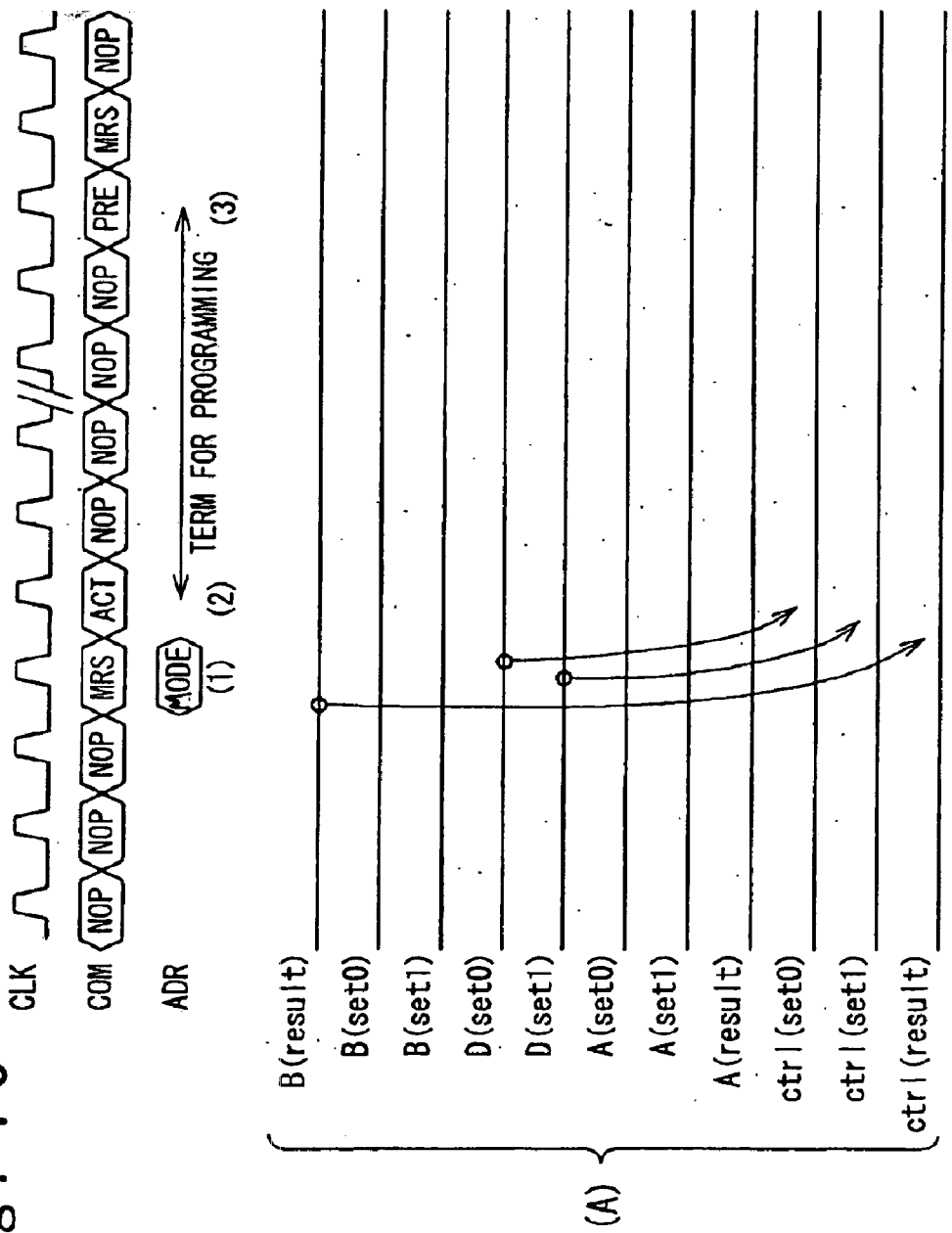
FIG. 10 is a timing chart showing an exemplary process of programming NVRAMs to store defective addresses.
Figure 11:
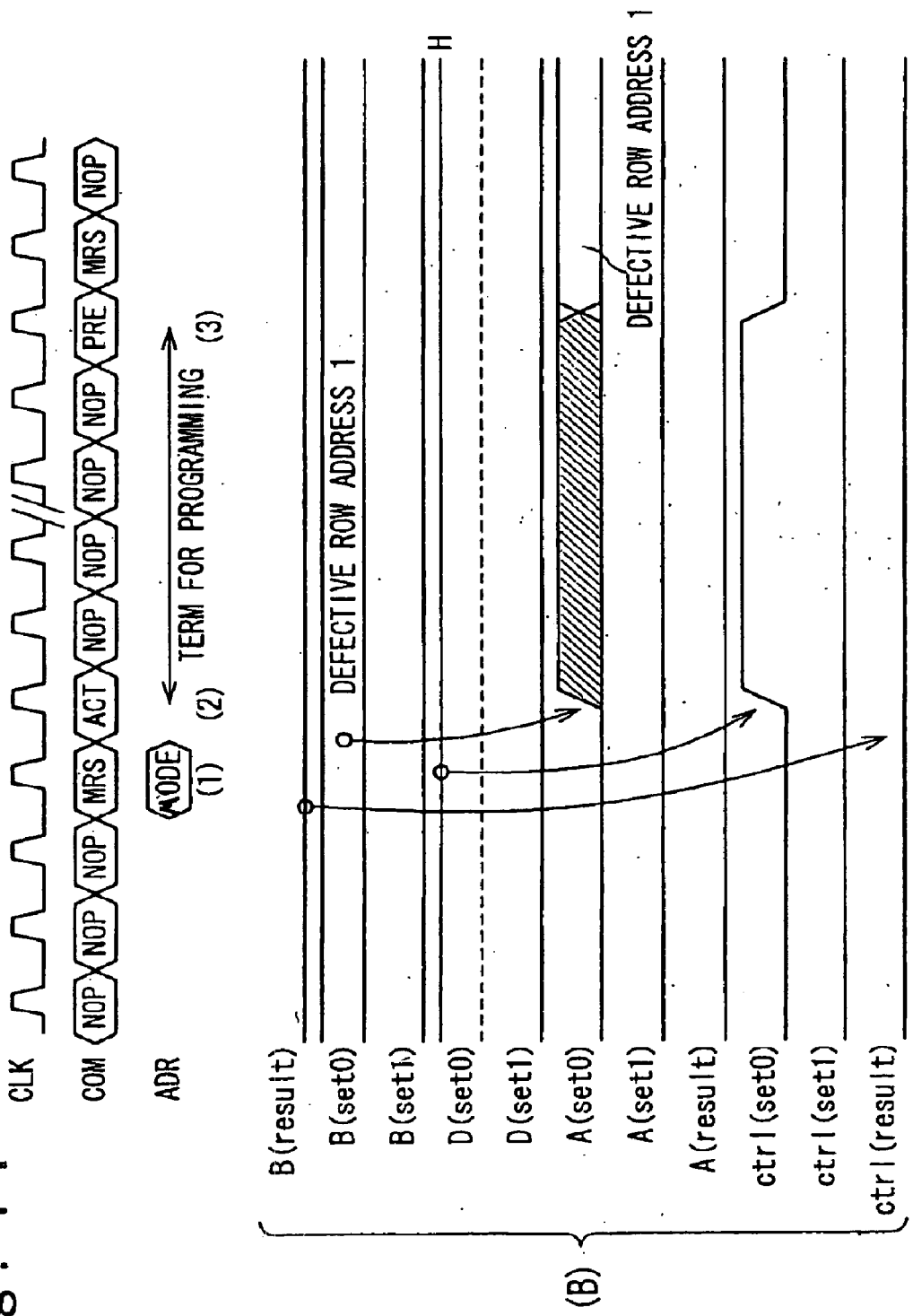
FIG. 11 is another timing chart showing another exemplary process of programming NVRAMs to store defective addresses.
Figure 12:
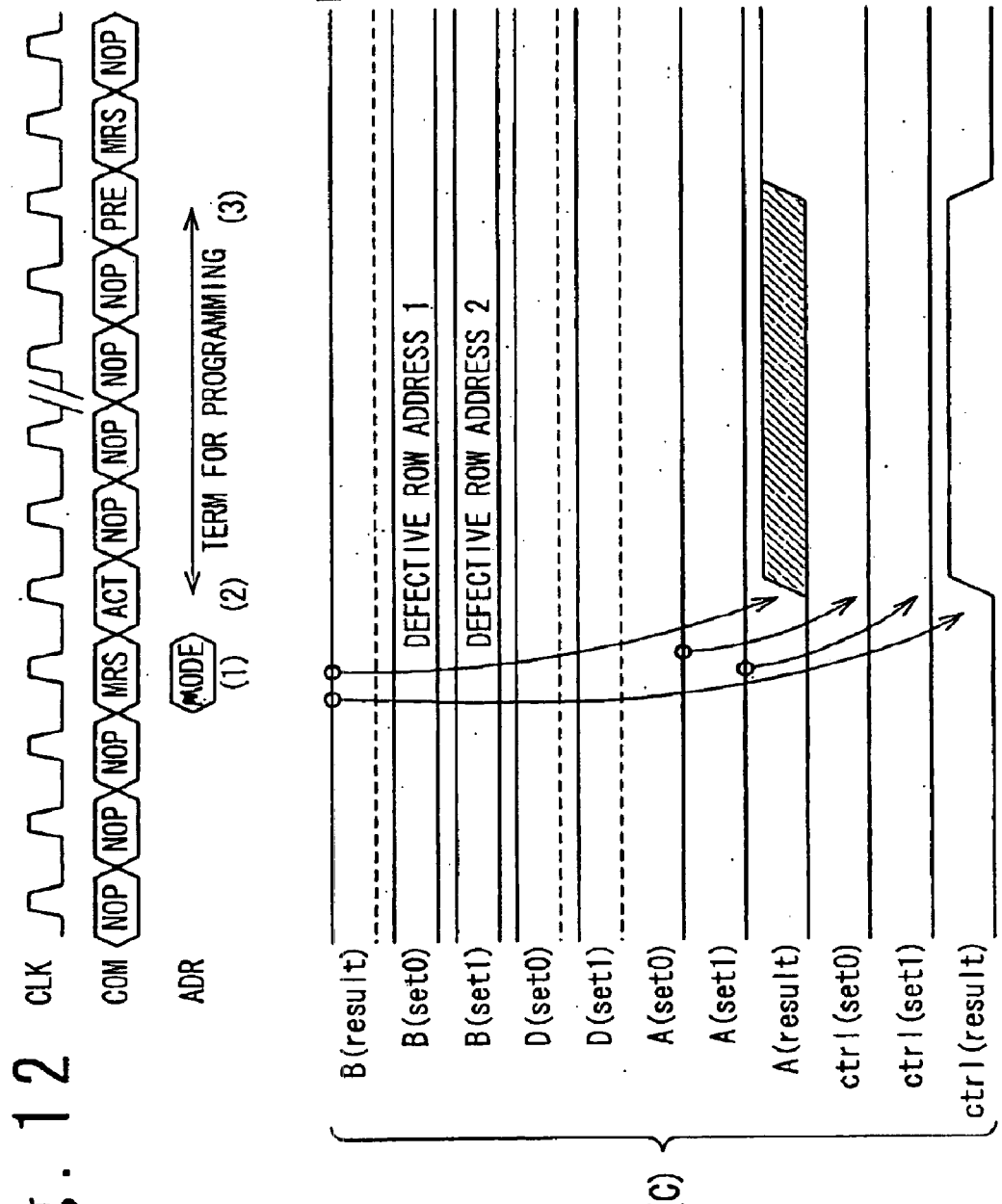
FIG. 12 is still another timing chart showing an exemplary process of producing a device fail signal when a memory cell array is unrepairable.

The tester 41 provides the control signals /CS, /RAS, /CAS, /WE, the command instruction, and the mode instruction to allow the command decoder 16 to issue the MRS command, as indicated by the symbols (1) in FIGS. 10 to 12. The mode instruction is produced so as to place the SDRAM 10 in a program mode for permitting the NVRAMs 105 to be programmed.

Then, the tester 41 provides the control signals /CS, /RAS, /CAS, /WE, and the command instruction to allow the command decoder 16 to issue an ACT command, as indicated by the symbols (2) in FIGS. 10 to 12. With reference to FIG. 4, the ACT command allows the control logic circuit 18 to develop the inner control signals In for all the control circuits 320 in the respective redundancy bank 301 to 320.

In response to the inner control signals In, the control circuits 320 transfers the latched defective row addresses B(set i) from the respective latch arrays 104 to the respective NVRAMs 105.

Then, the control circuits 320 activates the control signals Cntl(set i) to select the NVRAM(s) 105 in response to their associated latch enable bits D(set i). The control signals Cntl(set i) are activated when their associated latch enable signals D(set i) are activated. And, the NVRAMs 105 are selected when their associated control signals Cntl(set i) are activated.

The nonvolatile element 105B of the selected NVRAMs 105 are programmed to store therein the latched defective row addresses B(set i) as the defective row address A(set i).

In addition, the control circuits 320 activates the nonvolatile elements 105A of the selected NVRAMs 105 to set the respective NVRAM enable bits A'(set i) to logic 1.

For example, the NVRAM 105 of the address set SET<0> is selected when the latch enable signal D(set0) is activated. The latched defective row address B(set0) is transferred to the nonvolatile element array 105B in the same address set SET<0> to be stored therein. The nonvolatile element 105A in the address set SET<0> is also activated to set the NVRAM enable bits A'(set0) to logic 1.

With reference to FIG. 5B, the issued ACT command also allows the control logic circuit 18 to output the inner control signals In' to the control circuit 307 in the test result memory circuit 350. In response to the inner control signals In', the control circuit 307 activates the control signal Ctrl(result) when the device fail signal B(result) is activated by the latch 109. In response to the control signal Ctrl(result) being activated, the nonvolatile element 108 sets the device fail bit A(result) to logic 1, This allows information representing that the SDRAM 10 is failed to be stored in the nonvolatile element 108. Step 2 is then completed.

The programming of the NVRAMs 105 and the nonvolatile element 108 is executed while a plurality of non-operation commands (NOP command) are continuously issued by the command decoder 16 till a pre-charge command (PRE command) is issued, as indicated by the symbols (3) in FIGS. 10 to 12. The continuous issue of the NOP commands provides the waiting time for writing (term for programming) the defective row address into the NVRAMs 105 or the nonvolatile memory 108, whose operation speed is relatively slow.

After the series of the non-operation commands are issued, the MRS command is issued again to complete the programming of the NVRAMs 105.

FIGS. 10 to FIG. 12 shows exemplary processes of programming the NVRAMs 105 (and the nonvolatile element 108).

FIGS. 10 shows the case when no defective row address is found during the function test executed at Step 1. In this case, the function test disables all of the device fail signal B(result) and the latch enable signals D(set i), and holds the latched defective row addresses B(set0) reset.

Programming the NVRAMs 105 begins with the issue of the MRS command. The tester 41 generates the control signals /CS, /RAS, /CAS, and /WE, and the command instruction to allow the command decoder 16 to issue the MRS command as indicated the symbol (1) in FIG. 6. The SDRAM 10 is placed in the program mode in response to the mode instruction from tester 41 when the MRS command is issued.

Then, in response to the ACT command being issued, the control circuits 320 are activated. However, none of the latch enable signals D(set i) and the device fail signal B(result) is activated because no defective row is found. As a result, none of the control signals Ctrl(set0), Ctrl(set1), and Ctrl (result) is activated, and thus the defective row addresses A(set i) and the NVRAM enable bits A'(set i), both stored in the NVRAMs 105, and the device fail bit A(result) remain being reset.

FIG. 11 shows the case when one defective row address is found in a memory bank during the function test executed at Step 1. In this case, the function test holds the device fail signal B(result) and the latched defective row address B(set1) reset, while effectively storing the latched defective row address B(set0) in the latch array 104 in the address set SET<0>. The latch enable signal D(set0) is activated, while the latch enable signal D(set1) is disabled.

After the MRS command is issued to place the SDRAM 10 in the program mode, the ACT command is issued.

In response to the issue of the ACT command, the control signal Ctrl(set0) is activated by the control circuit 320, and thus the NVRAM 105 receives the latched defective row address B(set0) to be programmed to store it as the defective row address A(set0). The programming of the NVRAM 105 in the address set SET<0> is completed before the PRE command is issued.

FIG. 12 shows the case when three or more defective row addresses are found in a memory bank during the function test executed at Step 1, and thus the memory bank is unrepairable. In this case, the function test activates all of the device fail signal B(result), and the latch enable signals D(set0) and D(set1), and effectively stores the latched defective row addresses B(set0) and B(set1) in the latch arrays 104 in the address sets SET<0> and SET<1>.

In response to the device fail signal B(result) being activated, the control circuit 320 neglects the latch enable signals D(set0) and D(set1), and disables the control signals Ctrl(set0) and Ctrl(set1) to prohibit the programming of the NVRAMs 105.

On the other hand, the control circuit 307 activates the control signal Ctrl(result), and the activated nonvolatile element 108 sets the device fail bit A(result) to logic 1 in response to the activated control signal Ctrl(result). This allows the device fail bit A(result) to represent that the SDRAM 10 is unrepairable.

In order to detect various failures in the SDRAM 10, various function tests may be executed at Step 1. The programming of the NVRAMs 105 may follow each of the function tests, or follow the complete set of the function tests.

It should be noted, however, that programming the NVRAMs 105 must be executed before the power supply to the SDRAM 10 is shut off, because the latch arrays 104, which temporarily store the defective row addresses, is volatile.

Once the defective row addresses are stored in the NVRAMs 105, shutting the power supply off does not affect the storage of the defective row addresses and the selection of the address sets SET<i> to store defective row addresses. The programming of the NVRAMs 105 allows the defective row addresses to be permanently stored. In addition, the programming of the NVRAMs 105 activates the NVRAM enable signal C'(set i), and the redundancy mapping circuit 102 is able to avoid selecting the address sets SET<i> which already stores the defective row addresses.

Normal Operation

After programming the NVRAMs 105, the SDRAM 10 may be commercially used in a normal mode. When the SDRAM 10 is placed in the normal mode, the row decoder 13 selects the redundant rows 11a-1 instead of the defective rows found by the function test after packaging.

The selection of the redundant rows is achieved by the following process. With reference to FIG. 5A, the defective row addresses are read out from the NVRAMs 105 to store the latch arrays 104 in response to the SDRAM 10 being started up. The NVRAM enable latches 104A activate the NVRAM enable signals C(set i) in response to the NVRAM enable bits A'(set i) stored in the nonvolatile element 105A. The activated NVRAM enable signal(s) C(set i) activates its associated address compare circuit(s) 103.

Then, the bank address signals BA0 and BA1 and the address signals A0 to A12 are provided from an external circuit, such as a CPU, to identify one of the bank <0> to <3>, a row address, and an initial column address to be accessed. The redundancy bank associated with the identified bank is activated. The row address Row_Adr of the identified row is then provided for the address compare circuits 103 of the activated redundancy bank. The address compare circuits 103 each compare the row address Row_Adr to the defective row addresses B(set i) latched in their associated latch arrays 104 to produce the address hit signals Hit(set i), when the address compare circuits 103 are activated by their NVRAM enable signals C(set i). The address hit signals Hit(set i) are activated when the row address Row_Adr matches the defective row addresses B(set i), respectively. When the address hit signals Hit(set i) are activated, their associated redundant rows 11a-1 are selected instead of the primary rows.

It should be noted that the address compare circuits 103 are used not only for the selection of the redundant rows in the normal mode but also for the aforementioned comparison of the detected defective row addresses to the defective row addresses permanently or temporarily stored in the address sets SET<i>. The use of the address compare circuits 103 for the aforementioned tow purposes effectively reduces the chip size of the SDRAM 10.

CONCLUSION

The following is the advantageous features of the aforementioned on-chip mapping redundancy architecture in accordance with the present invention.

(1) The redundancy architecture in accordance with the present invention effectively improves the throughput of testing and repairing memory devices because of the following reasons.

First, the on-chip mapping redundancy architecture enables the concurrent production of the mapping from the defective row addresses to the redundant rows on the memory chips 42 (or the SDRAMs 10) during providing the test pattern by the tester 41. The production of the mapping is not required to executed after the completion of providing the test pattern.

Second, the on-chip mapping redundancy architecture effectively reduces the amount of data transferred between the tester 41 and the memory chips 42. Neither the transfer of the data on the failure of each memory cell nor on the mapping from the defective row addresses to the redundant rows is requested to be transferred between the tester 41 and the memory chips 42.

Third, the on-chip mapping redundancy architecture effectively facilitates the test and repair of a plurality of the memory chips 42 in parallel. The on-chip mapping redundancy architecture requests the tester 41 to provide the same test pattern and the same control signals for the memory chips 42 to be tested. The tester 41 is not required to provide a mapping from the defective row addresses to the redundant rows for each memory chip 42. Consequently, the on-chip mapping redundancy architecture allows the number of memory devices tested and repaired concurrently to be increased at a reduced cost.

(2) The necessary area of the redundancy architecture is small, and thus the use of the redundancy architecture is not accompanied by a large increase of the chip size.

Firstly, the redundancy architecture in accordance with the present invention excludes an FBM, a pattern generator, and a test pattern storage device, which have a large size, from the memory chips 42.

Secondly, the redundancy architecture allows the address compare circuits 103 and the latch arrays 104 to be used for respective two purposes. The address compare circuits 103 compares the defective addresses stored in the latch arrays 104 to the detected defective addresses to avoid the same defective addresses being stored in the different NVRAMs. In addition, the address compare circuits 103 compares received row addresses to the defective row addresses to allow the row decoder 12 to replace the defective rows with the redundant rows. The latch arrays 104, on the other hand, are used for temporarily storing the defective row addresses to be stored in the NVRAMs 105 while the SDRAM 10 is tested, and also used for latching the defective row addresses from the NVRAMs 105 to increase the access speed of the SDRAM 10 when the SDRAM 10 operates in the normal mode. This effectively reduces the chip size of the memory chip 42 implemented with the SDRAM 10.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

Especially, it should be noted that the terms "row" and "column" in this application merely mean a set of memory cells arranged in lines in different directions. One may refer to a set of memory cells arranged in a line as a "row", while another refers to the set of memory cells as a "column".

Also, it should be noted that one skilled in the art would appreciate that repairing the memory cell array 11 after the packaging may be achieved by replacing both defective rows and columns with respectively redundant rows and columns.

However, repairing the memory cell array 11 is preferably achieved by replacing only defective rows with redundant rows. This architecture is advantageous because it effectively reduces the chip size by simplifying the circuit logic of the NVRAM-based redundancy circuitry 110A. Replacing only the defective rows does not affect the efficiency of repairing the SDRAM 10, because most of the fails detected by a function test after the packaging consists of single bit errors, such as refresh errors.

What is claimed is:

1. A memory device comprising:
   a memory cell array including memory cells and first redundant cells;
   a data comparator comparing read data received from said memory cell array with anticipated data provided by an external tester to produce a data mismatch signal;
   a redundancy mapping circuit responsive to said data mismatch signal for detecting a defective address of said memory cell array;
   a nonvolatile memory storing said detected defective address; and
   a redundancy circuitry repairing said memory cell array by replacing ones of said memory cells associated with said defective address with said first redundant cells.

2. The memory device according to claim 1, wherein said defective address consists of one of row and column addresses of said memory cell array.

3. The memory device according to claim 2, further comprising:
   a fuse circuit including fuses storing both of a defective row address and a defective column address of said memory cell array,
   wherein said memory cell array further includes second redundant cells, and
   wherein said redundancy circuitry repairs said memory cell array by replacing ones of said memory cells associated with said defective row and column addresses stored in said fuse circuit with said second redundant cells.

4. The memory device according to claim 1, wherein said nonvolatile memory stores therein an NVRAM enable bit representative of whether said defective address is effectively stored in said nonvolatile memory, and
   wherein said redundancy mapping circuit provides an enable signal to allow said nonvolatile memory to store said defective address of said memory cell array detected by said redundancy mapping circuit in response to said NVRAM enable bit.

5. The memory device according to claim 4, wherein said redundancy mapping circuit produces a failure signal representative of a failure of said memory device in response to said NVRAM enable bit and said data mismatch signal.

6. The memory device according to claim 5, further comprising:
   a nonvolatile element storing a device failure bit representative of said failure of said memory device in response to said failure signal.

7. The memory device according to claim 1, wherein said redundancy circuitry includes an address compare circuit comparing said defective address detected by said redundancy mapping circuit with said defective address stored in said nonvolatile memory to produce a disable signal, and
   wherein said redundancy mapping circuit provides an enable signal to allow said nonvolatile memory to store said detected defective address in response to said disable signal.

8. The memory device according to claim 7, further comprising a decoder circuitry,
   wherein said address compare circuit compares said detected defective address with said stored defective address when said memory device is placed in a first mode,
   wherein said address compare circuit compares a received address with said stored defective address to produce an address hit signal when said memory device is placed in a second mode, and
   wherein said decoder circuitry selects, in response to said address hit signal, said first redundant cells instead of ones of memory cells associated with said received address.

9. A memory device comprising:
   a memory cell array including:
      primary memory cells arranged in primary rows, and redundant memory cells arranged in redundant rows;
   a plurality of nonvolatile memories respectively storing defective row addresses, wherein said plurality of nonvolatile memories respectively stores NVRAM enable bits representative of whether said defective row addresses respectively stored in said nonvolatile memories are effective;
   a redundancy circuitry repairing said memory cell array by replacing one of said primary rows associated with said defective address with said redundant rows,
   a data comparator comparing read data received from said memory cell array to anticipated data provided by an external tester to produce a data mismatch signal;
   a redundancy mapping circuit responsive to said data mismatch signal for detecting a defective row address and selecting one of said plurality of nonvolatile memories in response to said NVRAM enable bits, wherein said selected one of said plurality of nonvolatile memories stores said detected defective row address.

10. The memory device according to claim 9, wherein said redundancy mapping circuit includes an error counter storing a number of defective rows found to be replaced through a function test, and
    wherein said redundancy mapping circuit selects said one of said plurality of nonvolatile memories based on said number of defective rows.

11. The memory device according to claim 10, wherein said redundancy mapping circuit activates a fail signal based on said NVRAM enable bits and said number of defective rows when judging that said memory device is unrepairable.

12. The memory device according to claim 9, wherein said redundancy circuitry includes an address compare circuitry comparing said defective row address detected by said redundancy mapping circuitry with said defective row addresses stored in said nonvolatile memory to activate a disable signal, and
    wherein said redundancy mapping circuit selects none of said plurality of nonvolatile memories in response to said activated disable signal.

13. The memory device according to claim 12, further comprising a decoder circuitry,
   wherein said address compare circuit compares said detected defective address with said stored defective address when said memory device is placed in a first mode,
   wherein said address compare circuit compares a received address with said stored defective address to produce an address hit signal when said memory device is placed in a second mode, and
   wherein said decoder circuitry selects, in response to said address hit signal, said first redundant cells instead of ones of memory cells associated with said received address.

14. A memory device comprising:
   a memory cell array including memory cells and redundant cells;
   a data comparator comparing read data received from said memory cell array to anticipated data provided by an external tester to produce a data mismatch signal;
   a redundancy mapping circuit responsive to said data mismatch signal for detecting a defective address of said memory cell array;
   a nonvolatile memory storing said detected defective address;
   a volatile latch circuit latching said defective address from said nonvolatile memory;
   an address compare circuit comparing a received address with said latched defective address to produce an address hit signal, and
   a decoder circuitry selecting, in response to said address hit signal, said redundant cells instead of ones of memory cells associated with said received address.

15. The memory device according to claim 14, further comprising a control circuit, wherein when said memory device is placed in a first mode, said volatile latch circuit receives and latches said detected defective address from said redundancy mapping circuit,
   wherein said control circuit receives said latched defective address from said volatile latch circuit and writes said latched defective address in said nonvolatile memory, when said memory device is placed in a second mode, and
   wherein when said memory device is placed in a third mode, said volatile latch circuit latches said defective address from said nonvolatile memory, and said address compare circuit compares said received address with said latched defective address to produce said address hit signal.

16. The memory device according to claim 14, wherein said volatile latch circuit latches said defective address from said nonvolatile memory in response to said memory device being started up.

17. The memory device according to claim 14, further comprising a mode address register storing mode information on an operation mode in which said memory device is placed, said operation mode including said first to third mode,
   wherein said volatile latch circuit latches said defective address from said nonvolatile memory in response to an issue of an MRS command to allow said mode address register to rewrite said mode information.

18. A method of testing and repairing a memory device comprising:
   providing said memory device with a test pattern including test addresses and anticipated data for said test addresses by an external tester;
   comparing read data from memory cells identified by said test addresses with said anticipated data to detect a defective address by a circuitry implemented within said memory device;
   storing said defective address in a nonvolatile memory implemented within said memory device; and
   replacing memory cells associated with said defective address with redundant cells based on said defective address stored in said nonvolatile memory by a redundancy circuitry implemented within said memory device.

19. A method of testing and repairing a plurality of memory devices comprising:
   concurrently providing each of said memory device with a same test pattern including test addresses and anticipated data for said test addresses by an external tester;
   comparing read data from memory cells identified by said test addresses with said anticipated data to detect a defective address by a circuitry implemented within each of said plurality of memory devices;
   storing said defective address in a nonvolatile memory implemented within each of said memory device; and
   replacing memory cells associated with said defective address with redundant cells based on said defective address stored in said nonvolatile memory by a redundancy circuitry implemented within each of said memory device.

20. The method according to claim 19, wherein said storing includes:
   temporarily storing defective address in a volatile latch circuit implemented within each of said memory device, and
   concurrently providing said plurality of memory devices with a same control signal to allow said nonvolatile memory to receive said defective address from said volatile latch circuit and to be programmed to store said defective address.

21. A method of operating a memory device including a nonvolatile memory circuitry storing defective addresses and an address compare circuit, said method comprising:
   providing said memory device with a test pattern including test addresses and anticipated data for said test addresses by an external tester;
   comparing read data from memory cells identified by said test addresses with said anticipated data to detect a defective address by a circuitry implemented within said memory device;
   comparing by said address compare circuit said detected defective address with said defective addresses stored in said nonvolatile memory circuitry;
   additionally storing said detected defective address in said nonvolatile memory circuitry when said detected defective address matches none of said defective addresses stored in said nonvolatile memory circuitry;
   comparing by said address compare circuit a received address with said defective addresses stored in said nonvolatile memory circuitry;
   selecting redundant memory cells instead of memory cells identified with said received address when said received address matches one of said defective addresses stored in said nonvolatile memory circuitry.

22. A method of operating a memory device including a nonvolatile memory circuitry, a volatile latch circuit and an address compare circuit, said method comprising:
   providing said memory device with a test pattern including test addresses and anticipated data for said test addresses by an external tester;

comparing read data from memory cells identified by said test addresses with said anticipated data to determine a defective address by a circuitry implemented within said memory device;

temporarily storing said defective address in said latch circuit;

transferring said temporarily stored defective address from said latch circuit to said nonvolatile memory circuitry;

storing said transferred defective address in said nonvolatile memory circuitry;

latching said defective address stored in said nonvolatile memory circuitry by said latch circuit;

comparing by said address compare circuit a received address with said latched defective address; and selecting redundant memory cells instead of memory cells identified with said received address when said received address matches one of said latched defective address.

* * * * *